United States Patent [19]
Hetrick et al.

[11] Patent Number: 6,096,149
[45] Date of Patent: Aug. 1, 2000

[54] METHOD FOR FABRICATING ADHESION-RESISTANT MICROMACHINED DEVICES

[75] Inventors: Robert E. Hetrick, Dearborn Heights; Xia Zhang, Canton, both of Mich.

[73] Assignee: Ford Global Technologies, Inc., Dearborn, Mich.

[21] Appl. No.: 08/837,634

[22] Filed: Apr. 21, 1997

[51] Int. Cl.[7] ..................................................... B32B 31/00
[52] U.S. Cl. ........................... 156/155; 156/247; 156/267; 156/310; 156/344; 427/249; 427/258; 427/402; 427/404
[58] Field of Search ..................... 427/132, 504, 427/128–131, 244, 258, 402, 404; 156/643, 645, 655, 656, 657, 659.1, 247, 267, 310, 344, 155

[56] References Cited

U.S. PATENT DOCUMENTS

| | | | |
|---|---|---|---|
| 5,206,983 | 5/1993 | Guckel et al. | 29/598 |
| 5,364,497 | 11/1994 | Chau et al. | 156/645 |
| 5,793,485 | 8/1998 | Gourley | 356/318 |

*Primary Examiner*—Merrick Dixon
*Attorney, Agent, or Firm*—Damian Porcari

[57] ABSTRACT

A method for fabricating an adhesion-resistant microelectromechanical device is disclosed wherein amorphous hydrogenated carbon is used as a coating or structural material to prevent adhesive failures during the formation and operation of a microelectromechanical device.

24 Claims, 3 Drawing Sheets

METHOD FOR FABRICATING ADHESION-RESISTANT MICROMACHINED DEVICES

TECHNICAL FIELD

This invention is related to the use of amorphous hydrogenated carbon as a micromachined structure or as a coating on micromachined structures which prevents adhesion failures.

BACKGROUND ART

Micromachined structures have become increasingly important for a variety of applications. Movable mechanical elements such as cantilevers, beams, and diaphragms are often micromachined for sensors and actuators. Surface micromachining is a microfabrication technology that has attracted great attention, partly because it can produce micromachined structures that can be integrated with electronic devices. With this technology, a sacrificial layer, such as silicon oxide, is first deposited and patterned on a substrate, usually a silicon wafer already coated with silicon nitride. The film for the microstructure is then deposited and patterned. The sacrificial layer is then etched away to release the microstructure, leaving it freely suspended and anchored only where it directly contacts the substrate through the patterned opening of the sacrificial layer.

The large surface area to volume ratios of these microstructures, whether processed by surface micromachining, bulk micromachining, wafer dissolving and bonding process, or LIGA process, however, result in problems associated with unwanted adhesion between adjacent elements. Such adhesive failures have a direct impact on production yield and reliability of these devices.

The sticking of freely standing microstructures to the substrate is a principal source of failures in surface micromachined devices. Stiction occurs both immediately after the sacrificial etch release process and during operation of the device. During the rinse process and after release of the sacrificial layer by the wet etch process, the capillary force from the rinse liquid causes attraction between suspended elements of the device and the underlying substrate which causes these elements to adhere to the underlying substrate. Even after a successful release, problems with stiction may still arise if the microstructure is exposed to liquid, from any subsequent wet process, or water vapor condensation during device operation.

Previous approaches may reduce the likelihood of an adhesion failure to some degree but fail to eliminate the problem altogether. An example of a proposed approach is described in the Abe et al. reference, published in the *Proc. IEEE Mems Workshop*, p. 94, published on Jan. 29, 1995 in the Netherlands. This reference describes a process whereby the surface contact area is reduced by introducing bumps at the bottom of the surface of the freely standing structure. Another approach is published in *Transducers '93*, p. 288, by Alley et al., 1993 in Yokohama, Japan. The Alley et al. reference outlines different ways of increasing surface roughness of the substrate to reduce the real surface contact area. In another publication by Mulhern et al., *Transducers '93*, p. 296, 1993 in Yokohama, Japan, there is discussed a method of using super critical carbon dioxide drying to prevent stiction by eliminating capillary forces from the rinse liquid. However, this approach cannot eliminate post-rinse stiction problems. Yet another approach is presented by Houston et al. in *Proc. of the 8th International Conference on Solid-State Sensors and Actuators*, p. 210, Stockholm, Sweden, June 1995, wherein ammonium fluoride is used to treat a polysilicon structure surface to obtain a passivated hydrogen terminated surface. However, in the presence of air, the polysilicon surface oxidizes in less than one week and loses all the benefits from the treatment.

There thus remains a need for a method of reducing and preventing the stiction of micromachined structures for the life of a micromachined device.

SUMMARY OF THE INVENTION

Accordingly, an object of the present invention is to provide a technique for preventing and reducing adhesion failure both during the fabrication and operation of micromachined structures.

In addressing this need, the present invention discloses a process that either incorporates a coating for micromechanical structures including amorphous hydrogenated carbon (AHC) or doped amorphous hydrogenated carbon, or uses amorphous hydrogenated carbon to form micromechanical structures. Both approaches serve to reduce adhesive forces and thus prevent adhesion failure, as well as provide low friction and wear between the microelectromechanical structure and the underlying substrate.

DETAILED DESCRIPTION OF THE INVENTION

Figure 1:
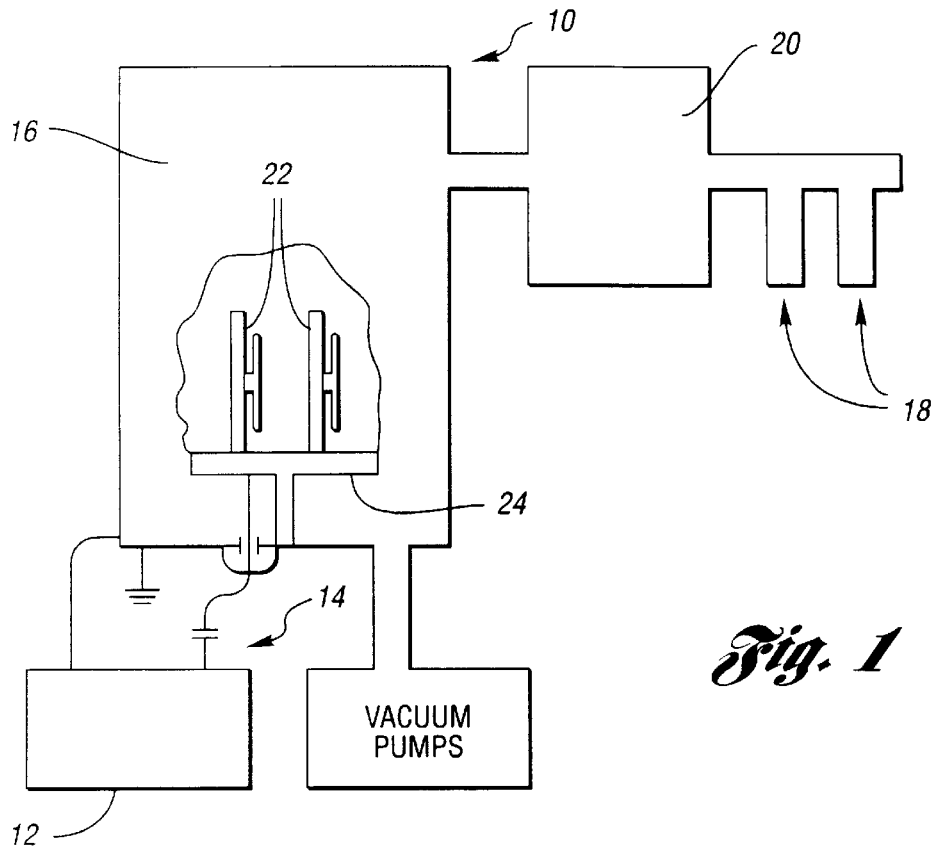
FIG. 1 illustrates a schematic diagram of a vacuum apparatus and associated equipment for applying a coating of AHC or depositing a structural layer of AHC by a plasma enhanced chemical vapor deposition (PE-CVD) method that employs radio frequency techniques.

The present invention teaches the use of amorphous hydrogenated carbon (AHC) as a protective coating on microelectromechanical structures (MEMS) or as a microelectromechanical structure to prevent the sticking of such microstructures to a substrate during fabrication or subsequent processes.

The term microelectromechanical structure as used herein is intended to include movable mechanical microstructure elements used in actuators, sensors, and other micromechanical devices.

While not wishing to be bound to any particular theory, it is believed that the use of amorphous hydrogenated carbon as a coating or as the structural layer serves to reduce adhesive forces in part due to the chemical inertness of the carbon composition. It is believed that the dominant forces acting between surfaces are capillary forces caused by meniscus formation. Capillary forces are created in polysilicon structures because silicon or polysilicon forms an oxide in air, which causes a hydrophilic surface. This hydrophilic surface attracts water which, in turn, causes an attraction between the microstructure and the substrate and results in stiction after drying.

This invention serves to reduce the adhesive forces between microstructure surfaces by altering their surface properties. The surface treatment or application of AHC is thus designed to create a hydrophobic surface. The hydrophobic nature of AHC means that water tends to repel itself from an amorphous hydrogenated carbon surface. Accordingly, in a MEMS device, the use of AHC as a protective coating or as a MEMS structure results in lower capillary forces and an associated reduction in stiction.

From an experimental viewpoint, a coating of AHC produces a surface with a low wetting or sticking tendency as measured by the "contact angle" between the coated surface and a droplet of water in a standard test apparatus. With the contact angle test, the attractive forces, or the adhesive energy between the liquid drop resting on a particular surface is revealed by the contact angle that the liquid makes with that surface. With a greater contact angle, there is a decrease in the adhesive force, as is discussed in "Network Modifications of DLC Coatings to Adjust a Defined Surface Energy" by K. Trojan et al. in *Physics Status Solid*, Vol. 145(a), p. 575, 1994. Our research indicated the contact angle of water on Si-containing AHC is about 85°, much larger than the 35° contact angle of water on silicon with a native oxide layer. The chemical inertness of AHC also helps to reduce any adhesion caused by inter-solid chemical interaction that bonds the microstructure to the substrate.

In addition to the anti-adhesion properties of AHC, there are other significant benefits associated with the use of AHC in conjunction with MEMS. As an example, the use of AHC as a protective coating on microelectromechanical structures serves to significantly reduce the friction generated by moving parts. Friction is another major design concern in microelectromechanical systems with moving parts, such as micromotors, microvibrators, or microresonators. Due to the reduced sizes and forces, the effect of friction forces in MEMS is even more significant than in macro devices. AHC's low coefficient of friction, in the range of 0.05–0.1, is thus a valuable property.

The use of AHC also results in a marked reduction in the wear of MEMS moving parts. Like friction, wear is another factor that directly affects the performance of these systems. The wear rate of AHC is typically in the range of $10^{-8}$ to $10^{-6}$ mm$^3$/Nm.

Notwithstanding the beneficial friction and wear properties, AHC provides high hardness, in the range between 12–20 GPa, and high Young's modulus, in the range between 120 to 180 GPa. Such mechanical properties make AHC a good material for mechanical structures in many MEMS applications. Cantilevers, beams, and membranes, and many other micromechanical elements can be made of AHC to take advantage of both surface and bulk properties of AHC.

The use of AHC for MEMS is further understood to prevent corrosion caused by humidity and other chemicals, due to the chemical inertness of the carbon composition. AHC is not etched significantly in almost all acids and bases, such as hydrofluoric acid, hydrochloric acid, sulfuric acid, nitric acid, sodium hydroxide and potassium hydroxide. Furthermore, amorphous hydrogenated carbon is a good insulator. Accordingly, AHC may also be used as a diffusion barrier in semiconductor devices.

In addition, experimental evidence has demonstrated that AHC adheres well to silicon, polysilicon, silicon dioxide, silicon nitride and many metal substrates, such as aluminum, titanium, and tungsten without use of an interlayer. This allows AHC to be used in a variety of applications for MEMS systems.

With this invention, amorphous hydrogenated carbon can be used to create the microelectromechanical structure or as a protective coating for microelectromechanical structures to provide a hard, low-wear and low-friction, chemical-inert material, which most importantly solves the stiction problem plaguing current micromachining processes.

The coating of the present invention, which creates an adhesion resistant surface, can be selected from the following group: amorphous hydrogenated carbon and doped hydrogenated carbon. The list of possible dopants, that are found to increase contact angle, include, but are not limited to, silicon, fluorine, boron, nitrogen, oxygen, niobium, tungsten, titanium, and tantalum.

The preferred coating or structural composition for microelectromechanical structures is silicon-doped amorphous hydrogenated carbon. Si-AHC is the preferred coating because of its thermal stability and ability to withstand humidity. Incorporation of silicon in AHC also reduces compressive stress in the film and facilitates deposition of AHC films up to at least 12 microns thick.

The amorphous hydrogenated carbon is formed from a hydrocarbon source, such as, for example: ethane, ethylene, acetylene, methane, butane, propane, hexane, benzene, toluene, xylene, and combinations thereof. An amorphous hydrogenated carbon coating of the present invention preferably has up to 20–60 atomic percent of hydrogen and most preferably between 35 and 50 atomic percent of hydrogen to achieve a low coefficient of friction. The AHC coating preferably is 100 Angstroms to 10 microns in thickness. Most preferably, the AHC coating has a thickness of between 500 Angstroms and 5000 Angstroms.

From a manufacturing standpoint, the amorphous hydrogenated carbon coating can be detected using laser Raman spectroscopy. Since AHC coatings yield a broad band at around 1500 cm$^{-1}$ and a shoulder band at around 1400 cm$^{-1}$ qualitative analysis using laser Raman spectroscopy is possible.

As a protective coating, amorphous hydrogenated carbon film can be conformally coated on microstructures in sensors and actuators after their fabrication. The amorphous hydrogenated carbon film coatings of the present invention can be applied by various techniques, including direct current, radio frequency, plasma-assisted chemical vapor deposition, ion beam deposition and arc discharge techniques.

While a number of different methods may be used to deposit these coatings onto a substrate, a preferred deposition method, involves a low pressure, plasma enhanced, chemical vapor deposition (PE-CVD) technique. The amorphous hydrogenated carbon is preferably deposited using the plasma deposition process disclosed in U.S. Pat. Nos. 5,237,967, 5,249,554 and 5,309,874 assigned to the Ford Motor Company. The disclosures of these three Ford patents are incorporated herein for reference.

As provided in FIG. 1, this low pressure, on the order of 1–100 milliTorr, deposition is carried out in a vacuum chamber 10 where an RF power supply 12 is capacitively coupled with a coupling capacitor 14 to electrodes whose electrical activation sustains the plasma 16 among appropriate precursor gases 18 admitted to the vacuum chamber 10 through a gaseous flow rate controller 20. One electrode is the substrate 22 to be coated, shown schematically as a silicon wafer, in combination with a support structure 24, while the other electrode in the simplest case, is the grounded wall of the vacuum system which surrounds, but is electrically insulated from the substrate 22.

The precursor gases 18 include at least one hydrocarbon species such as methane or other hydrocarbon gases to form the amorphous hydrogenated carbon. Other gaseous constituents can be included in appropriate proportions, for example, gases of silicon compounds can be included to provide a silicon dopant for the AHC film coating. Examples of the gases of silicon compounds include those of silicon tetrachloride, $SiCl_4$, silicon tetrafluoride, $SiF_4$, trichlorosilicon, $SiHCl_3$, and tetramethylsilicon, $Si$—$(CH3)4$.

In operation, the different electrical mobilities of the electrons and ions formed within the plasma results in the development of a negative potential on the substrate relative to the plasma, a "self bias" which acts to beneficially accelerate positive species composed of ionized precursors or gas constituents to the substrate where they react to form the desired coating. Important coating properties such as hardness, coefficient of friction, internal stress and the like are a function of the self bias potential. The self bias, which is not strictly a DC potential but has an alternating component at the applied RF frequency, is itself a function of many process parameters including pressure, gas composition, electrode shape, and the like, and is measured approximately during operation by measuring the potential between the substrates and ground. Optimum coating properties such as hardness, wear and coefficient of friction were found for self bias potential in the range from 200 V rms to 800 V rms, which corresponds to an average kinetic energy for carbon ions impacting the substrate of between 50 to 200 electron volts.

The PE-CVD technique is particularly advantageous for a number of reasons. First, it is a conformal technique in that the plasma surrounds or conforms to the surface of the structures which act as one of the electrodes for exciting the plasma. As a result, a complex surface of a MEMS structure may be coated with a uniform coating. This can not be achieved if a unidirectional ion beam coating technique is utilized even with rotation of the wafer.

In addition, the PE-CVD approach can be accomplished, by expending a small amount of power per unit surface area of substrate, at a substrate temperature that may be constrained in the range of 100° C. to 200° C. This temperature range does not cause any major concerns for materials and device structures already fabricated before the coating step.

Figure 2:
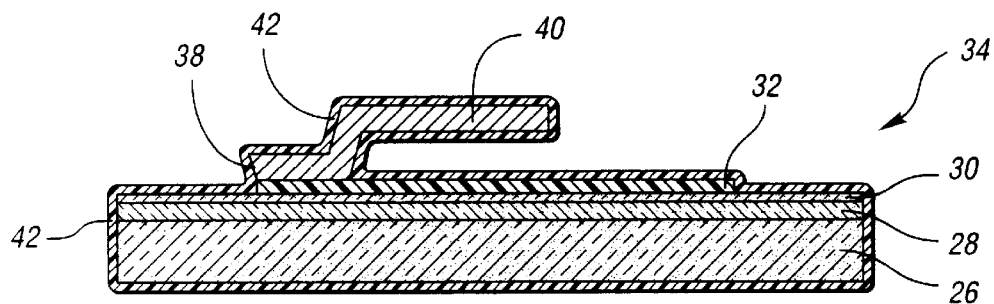
FIG. 2 illustrates a cross sectional view of one embodiment of a micromechanical device that is conformally coated with an amorphous hydrogenated carbon coating.
Figure 3:
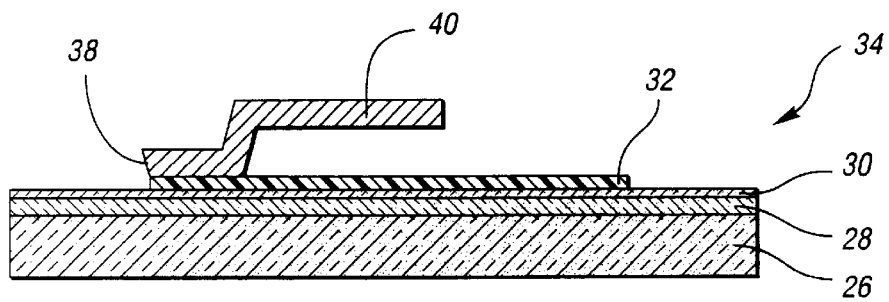
FIG. 3 illustrates a cross sectional view of another embodiment of a micromechanical device in which the microstructure is made of amorphous hydrogenated carbon.

As depicted in FIGS. 2 and 3, in surface micromachining, the micromachined device 34 typically consists of a silicon substrate 26 that may be coated with a passivating layer of silicon dioxide 28 and silicon nitride 30. A patterned layer 32 is applied on the substrate 26 or the coated substrate 30, as depicted. The device further includes a structural layer 40 in mating contact with the patterned layer. Desired microstructures are formed from the structural layer.

As depicted in FIG. 2, AHC can be conformally coated on the micromachined device 34 such that the at least one microstructure formed from the structural layer and the substrate are coated with the amorphous hydrogenated carbon coating 42. As depicted in FIG. 3, the structural layer 40 can alternately be made of amorphous hydrogenated carbon. With either embodiment, an adhesion, friction and wear-resistant micromachined device is fabricated.

In the following section, two examples illustrate the incorporation of AHC as a passivative coating for micromachined structures. The first example demonstrates post-process application of AHC as a protective coating to passivate a fabricated microelectromechanical device. The second example illustrates use of AHC to fabricate a micromachined structure. Though simple cantilever structures are used in both examples for demonstration purpose, it is clear that this invention can be applied in the same spirit to any microelectromechanical devices, including sensors such as accelerometers and pressure sensors, or actuators such as linear vibrators, rotational motors, as well as other micromechanical devices that having moving parts.

Example 1

Application of AHC as a Protective Coating on Micromachined Structures

In this example, AHC is used to coat a surface micromachined device 34, as depicted in FIG. 2, consisting of a substrate 26, a patterned polysilicon layer or bottom electrode 32, and a movable micromachined cantilever structure 40.

Figure 4:
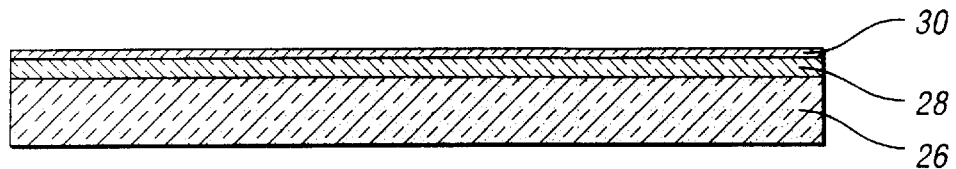
FIGS. 4–10 illustrate cross sectional views of step by step construction of the devices illustrated in FIGS. 2 and 3.

As illustrated in FIG. 4, a silicon wafer 26 is coated with an optional thermal silicon dioxide layer 28, which serves as a passivating layer, preferably having a thickness of 5000 Angstroms. While the substrate in this example is silicon, numerous other substrates function effectively. Possible substrates include, but are not limited to, quartz, glass, aluminum oxide and other such materials. A silicon nitride coating 30 is then applied to serve as a passivating layer onto the silicon substrate 26 or the silicon substrate 26 with a silicon dioxide layer 28. The silicon nitride layer 30 preferably has a thickness in the range of 500 Angstroms to 1500 Angstroms.

In the preferred embodiment, the substrate is coated with a passivating layer. This passivating layer serves as an insulating medium between the substrate and the patterned layer, which provides electrical interconnections for the microstructure. Depending on the substrate selected, the following passivating layers are preferred: silicon nitride and silicon dioxide. In the most preferred embodiment, where a silicon substrate is utilized, two passivating layers are preferred so that the substrate is first coated with a silicon dioxide layer followed by a silicon nitride layer. Again, the selection of the passivating layer is linked to the selection of the substrate, and thus, depending on the substrate selected, one or more passivating layers may be preferred.

Figure 5:
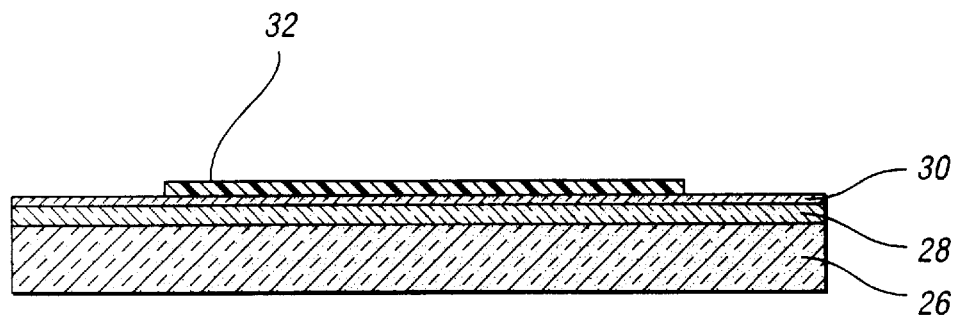

As depicted in FIG. 5, a patterned layer of phosphorous-doped polysilicon 32 is deposited by low- temperature chemical vapor deposition (LPCVD) at 600° C., the phosphorous-doped polysilicon layer 32 having a preferred thickness of 3000 Angstroms. This polysilicon layer 32 is next preferably patterned with a first mask by reactive-ion etch in a chlorine plasma. This patterned polysilicon layer 32 serves as a bottom electrode and provides electrical interconnections for the MEMS device. For example, where the MEMS device is a capacitor or the like, the patterned layer may serve as a bottom electrode. As the electrical connecting layer, the patterned layer should be made of a conductive material. Accordingly, the most preferred composition for the patterned layer is polysilicon. Other preferred materials for the patterned layer include such metals as tungsten, aluminum, chromium, palladium, and gold.

Figure 6:
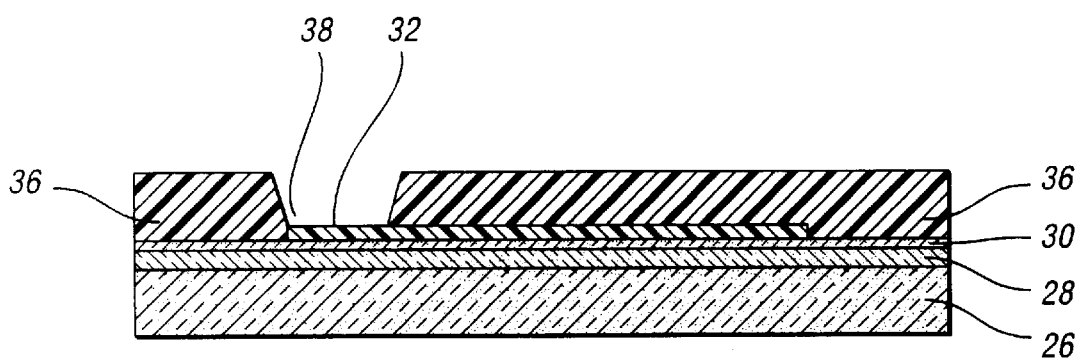

As further depicted in FIG. 6, an LPCVD sacrificial layer 36, preferably made of a phosphosilicate glass (PSG), has a preferred thickness between one micrometer and six micrometers, is deposited at 450° C. and densified at 950° C. for one hour, followed by a second masking step that exposes an anchor 38. The anchor 38 provides contact between the structural layer 40 and the patterned layer 32.

Figure 7:
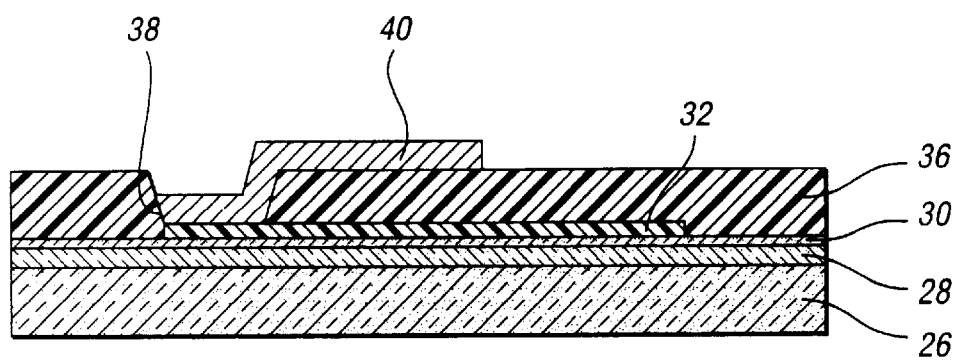

As illustrated in FIG. 7, a structural layer 40, preferably a thick doped polysilicon layer, is next deposited, preferably having a thickness between 1 micrometer and 5 micrometers using an LPCVD method at 610° C. This polysilicon structural layer 40 is next annealed at 1000° C. to release structural stress. The polysilicon layer 40 is next patterned by a third mask to form a top electrode and the desired microstructures. The sacrificial layer 36 and the structural layer 40 work together, since the sacrificial layer 36 is removed to release the microstructures within the structural layer and thus the composition of the two layers is inextricably linked. The relationship of the sacrificial layer to the structural layer should be such that when the sacrificial layer is etched off, the overlaying structural layer 40 remains intact.

Accordingly, where the structural layer 40 is polysilicon, the preferred sacrificial layer is phosphosilicate glass. Other pairing combinations include, but are not limited to, a silicon nitride structural layer with a polysilicon sacrificial layer and a nickel structural layer with an aluminum sacrificial layer.

Where a multi-layer microstructure is desired, such as, for example, a parallel capacitor, the sacrificial layer 36 and the structural layer 40 can be repeated. Accordingly, for such multi-layer microstructures, the structural layer 40 will have a second sacrificial layer and a second structural layer applied thereon to create the desired multi-layer microstructure.

Figure 8:
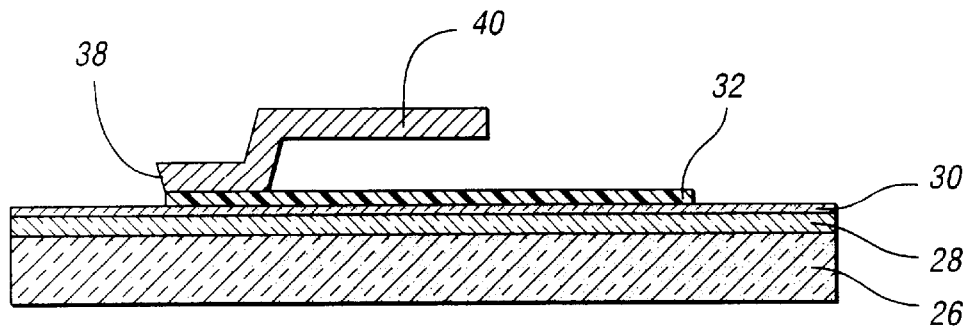

The wafer is then immersed in a wet etching solution, such as in hydrofluoric acid or buffered HF acid solution to remove the sacrificial PSG layer 36, as depicted in FIG. 8. Following this step, the wafer is properly rinsed and preferably dried using a supercritical carbon dioxide sublimation process. Depending on the sacrificial layer selected, the etching solvent will of course vary.

An AHC layer 42 is next applied conformally to cover the microstructures 40, and the substrate as depicted in FIG. 2, in a plasma-assisted CVD process. The AHC layer 42 is preferably applied to have a thickness between 500 Angstroms and 5000 Angstroms, with a most preferred thickness of 1000 Angstroms. The AHC layer 42 is preferably deposited using methane as a precursor gas, with a flow of 30 sccm at a pressure of 20 millitorr. The sample is self-biased through the RF power supply at 500 Volts. FIG. 2 shows a finished micromachined device with an AHC coating.

The presence of the AHC coating on the substrate effectively prevents or reduces sticking failures during operation of the fabricated MEMS devices.

Example 2

Application of AHC as a Micromachined Structure

In this example, application of AHC is incorporated in a surface micromachining process to form a movable cantilever that is made of AHC.

The first three steps of this process consist of preparing a substrate 26, such as a silicon wafer with a silicon dioxide coating 28 and a silicon nitride coating 30, to provide two passivated coatings, depositing a patterned polysilicon layer 32, and depositing and patterning a sacrificial layer 36 made of PSG, which is described in detail in the section above and as shown in FIGS. 4–6.

Figure 9:
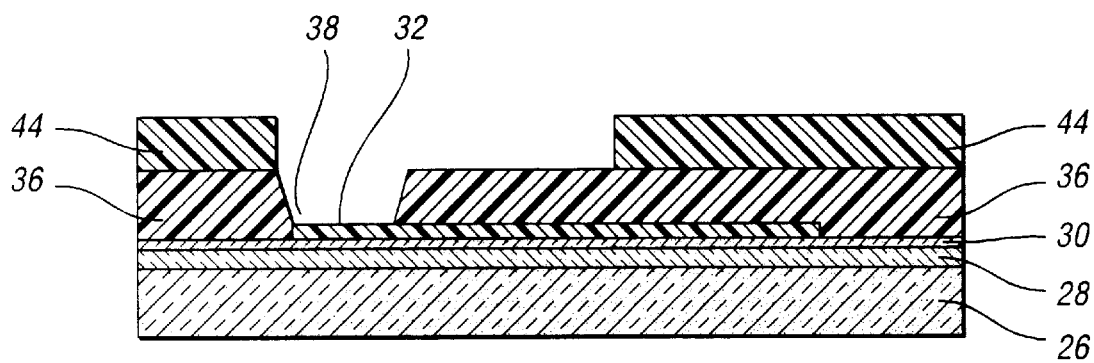

As further depicted in FIG. 9, a release layer 44, such as a photoresist layer, is then spun on to the micromachined device 34, preferably having a thickness between one micrometer and six micrometers, followed by a photolithography step that defines the overlaying AHC coating. The release layer, most preferably a photolithography patterned photoresist layer, facilitates patterning of the AHC layer. With this preferred embodiment, solvent will attack the photoresist layer and remove the AHC deposited on top of the photoresist layer, while leaving the AHC deposited underlying material to form patterned structures.

Figure 10:
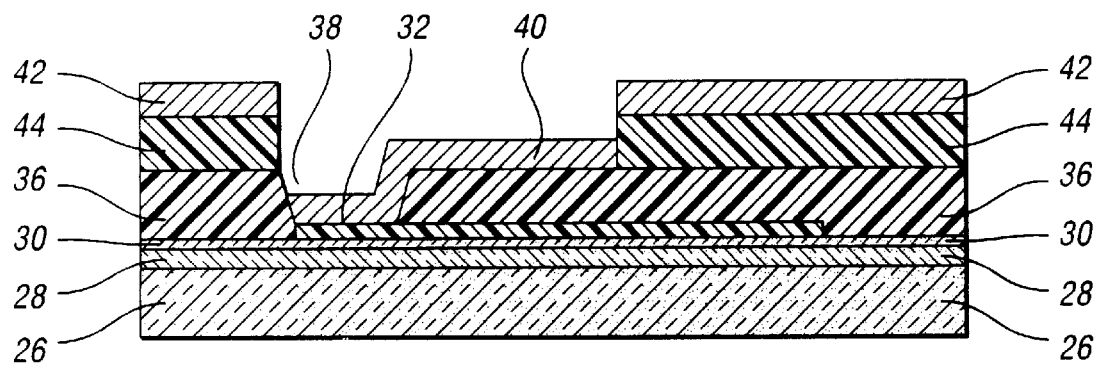

A structural layer of a thick film of amorphous hydrogenated carbon 40 and 42 is next deposited, as shown in FIG. 10, preferably having a thickness between 1 micrometer and 5 micrometers. The AHC structural layer 40 and 42 is preferably deposited using methane as a precursor gas, with a flow of 30 sccm at a pressure of 20 millitorr. The sample is self-biased through the RF power supply at 500 Volts.

The substrate 26 is first immersed in a solvent, such as acetone, to remove the release layer. The AHC layer 42 overlaying the release layer 44 is removed by a "lift-off process", leaving only a patterned AHC structural layer 40. The substrate 26 is then immersed in an etching agent such as hydrofluoric acid or buffered HF acid solution to remove the sacrificial PSG layer 36. Depending on the sacrificial layer selected, the etching solvent will of course vary. Following this step, the wafer is properly rinsed in deionized water and dried, as depicted in FIG. 3.

Where the microstructure consists of AHC, there is required a method for patterning the AHC depending on the desired microstructure. As previously mentioned, AHC is preferably patterned by a lift-off process, whereby an AHC film is deposited on a photolithography patterned photoresist release layer. Subsequent investigations also indicate that it is possible to pattern AHC by plasma etch in chlorine or fluorine based chemistry using a patterned photoresist layer as a masking material, which can be stripped later in a solvent or oxygen plasma.

While the most preferred release layer consists of a photoresist layer, polymers such as polyamides, pyridine, and the like are also suitable, as long as the polymer selected is composed of a material which can be etched by a solvent without the underlying AHC structural layer being simultaneously etched. Similarly, the etching solvent must not attack the underlying AHC structural layer. The following is a list of some suitable acids and bases: hydrofluoric acid, hydrochloric acid, sulfuric acid, nitric acid, sodium hydroxide, and potassium hydroxide.

The presence of the AHC layer on the substrate effectively prevents or reduces sticking failures during the rinse and drying process that follow the release of the polysilicon structure. The AHC microstructure will also prevent or reduce sticking failures during operation of the MEMS device.

Although the examples only illustrate the incorporation of amorphous hydrogenated carbon coating with surface micromachined structures, those who are familiar in the art to which this invention relates will recognize that the spirit of this invention can be equally applied to other micromachined processes, including but not limited to bulk micromachining, wafer bonding and wafer dissolving, and LIGA-like process.

While the best mode and viable alternate embodiments for carrying out the invention have been described in detail as shown on the drawings, those skilled in the art to which this invention relates will recognize various alternative designs and embodiments for practicing the invention as defined by the following claim.

What is claimed is:

1. A method of forming an adhesion-resistant micromachined device, comprising the steps of:
   providing a substrate:
   applying a patterned layer on said substrate;
   applying a sacrificial layer on said patterned layer;

applying a structural layer on said sacrificial layer to create at least one micromachined structure;

removing said sacrificial layer to release said at least one micromachined structure from said structural layer; and applying an amorphous hydrogenated carbon coating on said micromachined device, such that said at least one micromachined structure and said substrate are coated with said amorphous hydrogenated carbon consisting to prevent adhesion failure.

2. The method of claim 1, wherein said substrate is selected from the group consisting of silicon, glass, quartz, and aluminum oxide.

3. The method of claim 1, wherein said substrate is coated with a substrate coating selected from the group consisting of silicon nitride, silicon dioxide and the combination of silicon nitride and silicon dioxide.

4. The method of claim 1, wherein said method further includes the step of applying on said structural layer a second sacrificial layer and a second structural layer to create a multi-layer microstructure.

5. The method of claim 1, wherein said structural layer is selected from the group consisting of polysilicon, silicon nitride and nickel.

6. The method of claim 1, wherein said amorphous hydrogenated carbon coating is a doped amorphous hydrogenated carbon selected from the group consisting of silicon-doped amorphous hydrogenated carbon, fluorine-doped amorphous hydrogenated carbon, boron-doped amorphous hydrogenated carbon, nitrogen-doped amorphous hydrogenated carbon, oxygen-doped amorphous hydrogenated carbon, niobium-doped amorphous hydrogenated carbon, tungsten-doped amorphous hydrogenated carbon, titanium-doped amorphous hydrogenated carbon and tantalum-doped amorphous hydrogenated carbon.

7. The method of claim 1, wherein said sacrificial layer is removed with an etching solvent selected from the group consisting of hydrofluoric acid, hydrochloric acid, sulfuric acid, nitric acid, sodium hydroxide, potassium hydroxide and an aluminum etchant.

8. The method of claim 1, wherein said sacrificial layer is selected from the group consisting of phosphosilicate glass, silicon, polysilicon and aluminum.

9. The method of claim 1, wherein said amorphous hydrogenated carbon coating is 1000 Angstroms in thickness.

10. The method of claim 1, wherein said amorphous hydrogenated carbon coating is 500 to 5000 Angstroms in thickness.

11. The method of claim 1, wherein said amorphous hydrogenated carbon coating is applied by a chemical vapor deposition technique.

12. The method of claim 1, wherein said amorphous hydrogenated carbon coating is formed form a hydrocarbon source selected from the group consisting of ethane, ethylene, acetylene, methane, butane, propane, hexane, benzene, toluene, xylene and combinations thereof.

13. The method of claim 1, wherein said amorphous hydrogenated carbon coating comprises hydrogen having a concentration of 20–60 atomic percent.

14. The method of claim 1, wherein said amorphous hydrogenated carbon coating comprises hydrogen having a concentration of 35–50 atomic percent.

15. The method of claim 1, wherein said amorphous hydrogenated carbon coating yields a broad band at around 1550 $cm^{-1}$ and a shoulder band at around 1400 $cm^{-1}$ when detected by laser Raman spectroscopy.

16. The method of claim 1, wherein said step of applying an amorphous hydrogenated carbon coating further comprises:

placing said substrate in a vacuum chamber;

evacuating gas within said vacuum chamber;

establishing a reactive gas mixture within said vacuum chamber, wherein said reactive gas mixture is selected from the group consisting of gaseous silicon compounds, gaseous hydrocarbon compounds and mixtures thereof; and establishing a plasma discharge within said vacuum chamber, such that said substrate is an electrode in said plasma discharge and said amorphous hydrogenated carbon coating is deposited on said substrate.

17. The method of claim 16, wherein said step of applying an amorphous hydrogenated carbon coating is maintained at a temperature less than 200° C. to avoid thermal alterations of said substrate.

18. The method of claim 16, wherein said gaseous silicon compounds are selected from the group consisting of: diethylsilane, silicon tetrachloride, silicon tetrafluoride, trichlorosilicon, and tetramethylsilicon.

19. The method of claim 1, wherein said patterned layer is selected from the group consisting of polysilicon, tungstsen, aluminum, chromium, palladium and gold.

20. A method of forming an adhesion-resistant micromachined device, comprising the steps of:

providing a substrate;

applying a patterned layer on said substrate;

applying a sacrificial layer on said substrate;

applying a release layer on said sacrificial layer;

forming an amorphous hydrogenated carbon structural layer on said release layer;

removing said release layer to pattern said amorphous hydrogenated carbon structural layer; and removing said sacrificial layer to release at least one micromachined structure from said amorphous hydrogenated structural layer.

21. The method of claim 20, wherein said release layer is a photolithography patterned photoresist layer.

22. The method of claim 20, wherein said release layer is a polymer selected from the group consisting of polyamide and pyridine.

23. The method of claim 20, further comprising the step of patterning said sacrificial layer with a wet etch solvent to provide contact for anchoring said at least one structural layer.

24. The method of claim 20, further comprising the step of patterning said amorphous hydrogenated carbon structural layer with a mask to form said at least one micromachined structure.

* * * * *